US 6,835,616 B1

(12) United States Patent
Ben-Tzur et al.

(10) Patent No.: US 6,835,616 B1
(45) Date of Patent: Dec. 28, 2004

(54) METHOD OF FORMING A FLOATING METAL STRUCTURE IN AN INTEGRATED CIRCUIT

(75) Inventors: Mira Ben-Tzur, Sunnyvale, CA (US); Krishnaswamy Ramkumar, San Jose, CA (US); James Hunter, Campbell, CA (US); Thurman J. Rodgers, Woodside, CA (US); Mike Bruner, Saratoga, CA (US); Klyoko Keuchi, Sunnyvale, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 10/059,823

(22) Filed: Jan. 29, 2002

(51) Int. Cl.[7] ............................................. H01L 21/8242
(52) U.S. Cl. ........................................ 438/244; 438/253
(58) Field of Search ................................. 438/244, 253, 438/296, 387, 397, 254, 619.052, FOR 432; 216/2, 11; 148/DIG. 159

(56) References Cited

U.S. PATENT DOCUMENTS

| | | |
|---|---|---|
| 4,190,488 A | 2/1980 | Winters |
| 4,498,953 A | 2/1985 | Cook et al. |
| 4,749,440 A | 6/1988 | Blackwood et al. |
| 4,789,648 A | 12/1988 | Chow et al. |
| 4,944,836 A | 7/1990 | Beyer et al. |
| 4,956,313 A | 9/1990 | Cote et al. |
| 5,030,319 A | 7/1991 | Nishino et al. |
| 5,262,354 A | 11/1993 | Cote et al. |
| 5,312,777 A | 5/1994 | Cronin et al. |
| 5,354,416 A | 10/1994 | Okudaira et al. |
| 5,397,741 A | 3/1995 | O'Connor et al. |
| 5,453,639 A | 9/1995 | Cronin et al. |
| 5,534,107 A | 7/1996 | Gray et al. |
| 5,676,587 A | 10/1997 | Landers et al. |
| 5,716,495 A | 2/1998 | Butterbaugh et al. |
| 5,726,480 A | 3/1998 | Pister |
| 6,015,599 A * | 1/2000 | Keller et al. ............... 428/34.4 |
| 6,117,748 A * | 9/2000 | Lou et al. .................... 438/400 |
| 6,197,610 B1 | 3/2001 | Toda |
| 6,254,792 B1 | 7/2001 | Van Buskirk et al. |
| 6,271,145 B1 | 8/2001 | Toda |
| 6,290,864 B1 | 9/2001 | Patel et al. |
| 6,331,459 B1 * | 12/2001 | Gruening ..................... 438/243 |
| 6,372,632 B1 * | 4/2002 | Yu et al. ...................... 438/634 |
| 6,436,787 B1 * | 8/2002 | Shih et al. .................... 438/396 |
| 6,461,888 B1 * | 10/2002 | Sridhar et al. ................. 438/52 |
| 6,496,348 B2 * | 12/2002 | McIntosh ..................... 361/115 |
| 6,531,331 B1 * | 3/2003 | Bennett et al. ................ 438/48 |
| 6,555,467 B2 * | 4/2003 | Hsu et al. .................... 438/633 |
| 2003/0036215 A1 * | 2/2003 | Reid ............................ 438/52 |
| 2003/0054588 A1 * | 3/2003 | Patel et al. ................... 438/107 |
| 2003/0073302 A1 * | 4/2003 | Huibers ....................... 438/622 |

OTHER PUBLICATIONS

Frederico et al. Silcion Sacrificial Layer Dry Etching (SSLDE) for free–standing RF MEMS architecture, IEEE Mar. 3, 2003; pp. 570–573.*

H.F. Winters and J. W. Coburn, The etching of silicon with XeF2 vapor, Appl. Phys. Lett. Jan. 1979, pp. 70–73, vol. 34, No. 1, IBM Research Lab, San Jose, California, USA.

(List continued on next page.)

*Primary Examiner*—George Fourson
*Assistant Examiner*—Fernando L. Toledo
(74) *Attorney, Agent, or Firm*—Okamoto & Benedicto LLP

(57) ABSTRACT

In one embodiment, a sacrificial layer is deposited over a base layer. The sacrificial layer is used to define a subsequently formed floating metal structure. The floating metal structure may be anchored into the base layer. Once the floating metal structure is formed, the sacrificial layer surrounding the floating metal structure is etched to create a unity-k dielectric region separating the floating metal structure from the base layer. The unity-k dielectric region also separates the floating metal structure from another floating metal structure. In one embodiment, a noble gas fluoride such as xenon difluoride is used to etch a sacrificial layer of polycrystalline silicon.

10 Claims, 12 Drawing Sheets

OTHER PUBLICATIONS

V.S. Aliev and V.N. Kruchinin, Development of Si (100) surface roughness at the initial stage of etching in F2 and XeF2 gases: ellipsometric study, Surface Science 442 (1999) pp. 206–214, Elsevier Science, Novosibirsk, Russia.

F.A. Houle, Dynamics of SiF4 desorption during etching of silicon by XeF2, J. Chem. Phys. Aug. 1987, pp. 1866–1872, vol. 87, No. 3, IBM Research Center, San Jose, California, USA.

D.E. Ibbotson, J.A. Mucha, and D.L. Flamm, J.M. Cook, Plasmaless dry etching of silicon with fluorine–containing compounds, J. Appl. Phys., Nov. 15, 1984, pp. 2939–2942, vol. 56, No. 10, AT&T Bell Laboratories, Murray Hill, New Jersey, and Allentown, Pennsylvania, USA.

Dale E. Ibbotson, Daniel L. Flamm, John A. Mucha, and Vincent M. Donnelly, Comparison of XeF2 and F–atom reactions with Si and SiO2, Appl. Phys. Lett. Jun. 15, 1984, pp. 1129–1131, vol. 44, No. 12, AT&T Bell Laboratories, Murray Hill, New Jersey, USA.

Chung–Hui Chen, Yean–Kuen Fang, Chih–Wei Yang, and C.S. Tang, A Deep Submicron CMOS Process Compatible Suspending High–Q Inductor, IEEE Electron Device Letters, Nov. 11, 2001, pp. 522–523, vol. 22, No. 11, Taiwan R.O.C.

Thomas E. Wade, Gas Dome System , Provides Unity–K Dielectric, Semiconductor International, pp. 125, 126,128, 130, and 133, University of South Florida, Tampa, Florida, USA.

Karl Bohringer, EE 539 Autumm 1999, Slide 1–14 [retrieved on Nov. 20, 2001]. Retrieved from the internet: <URL:http//www.ee.washington.edu/class/539/Lectures/lecture3/sld001–014.html>.

* cited by examiner

METHOD OF FORMING A FLOATING METAL STRUCTURE IN AN INTEGRATED CIRCUIT

BACKGROUND OF THE INVENTION

1. Field of the Invention

The present invention relates generally to integrated circuit fabrication, and more particularly to processes for forming metal structures in integrated circuits.

2. Description of the Background Art

The speed at which a signal is propagated in an integrated circuit is limited by the delay through the interconnect line carrying the signal. This delay, commonly known as "RC delay," is due to the resistance and capacitance of the interconnect line. Reducing the resistance or capacitance of an interconnect line lowers its RC delay and increases signal propagation speed. Thus, reducing the RC delay of interconnect lines plays a major role in making integrated circuits run faster.

Using a low-resistance interconnect material such as copper helps lower the resulting RC delay. To reduce capacitance, the thickness of the dielectric layer separating the interconnect line from the substrate may be increased. The just mentioned dielectric layer may be made of a low dielectric constant material, also referred to as a low-k dielectric, to further reduce capacitance on the interconnect line. For similar reason, low-k dielectrics may also be used between side-by-side or overlying interconnect lines.

A low-k dielectric is also desirable in forming an inductor in an integrated circuit. The quality factor ("Q") of such an on-chip inductor is affected by the capacitance between a metal portion of the inductor and an underlying substrate, and the capacitance between metal portions of the inductor. The use of low-k dielectrics lowers capacitance in the aforementioned inductor regions, and thereby increases the Q of the inductor.

A low-k dielectric region may be formed by using a TEOS oxide to fill gaps between metal lines. The inability of the TEOS oxide to completely fill the gaps results in air gaps between the metal lines. Because air has a dielectric constant of 1, the resulting air gaps help lower capacitance. However, the formation of the resulting air gaps is not controllable, and their size varies depending on the metal etch profile and available space. Additionally, the TEOS oxide fills the space between metal layers. Various relatively complicated unity-k dielectric structures have also been proposed to lower capacitance on metal lines.

SUMMARY

The present invention relates to a novel method of forming a floating metal structure in an integrated circuit. In one embodiment, a dielectric region separates a floating metal structure from an underlying substrate or another floating metal structure. The dielectric region is an air core rather than a dielectric material. Because air has a dielectric constant of 1, the resulting dielectric region provides relatively low capacitance. The present invention may be used in a variety of applications including, without limitation, in the formation of interconnect lines and on-chip inductors.

In one embodiment, a sacrificial layer is deposited over a base layer. The sacrificial layer is used to define a subsequently formed floating metal structure. The floating metal structure may be anchored into the base layer. Once the floating metal structure is formed, the sacrificial layer surrounding the floating metal structure is etched to create a unity-k dielectric region separating the floating metal structure from the base layer. The unity-k dielectric region also separates the floating metal structure from another floating metal structure. In one embodiment, a noble gas fluoride such as xenon difluoride is used to etch a sacrificial layer of polycrystalline silicon.

These and other features and advantages of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, process parameters, thicknesses, materials, steps, and structures to provide a thorough understanding of embodiments of the invention. Persons of ordinary skill in the art will recognize, however, that the invention can be practiced without one or more of the specific details, or with other apparatus, process parameters, thicknesses, materials, steps, and structures. In other instances, well-known details are not shown or described to avoid obscuring aspects of the invention.

Figure 1A:
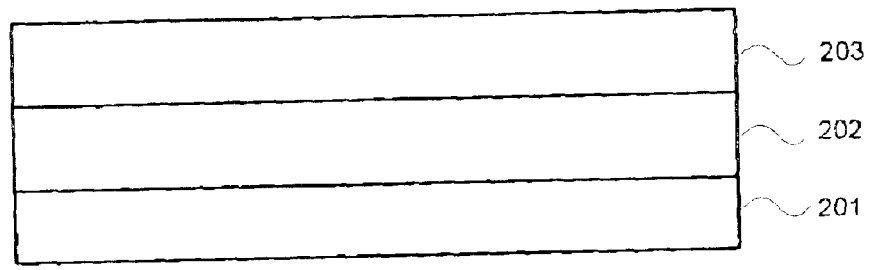
FIGS. 1A–1H show sectional views illustrating the formation of a floating metal structure in accordance with an embodiment of the present invention.

A method of forming a floating metal structure in an integrated circuit in accordance with an embodiment of the present invention is now described with reference to the sectional views of FIGS. 1A–1H. In FIG. 1A, a base layer 202 is deposited on a substrate 201. Base layer 202 provides a support on which a floating metal structure is formed. In some applications, a base layer may not be required; in that case, the floating metal structure is formed on the substrate. Base layer 202 is preferably of a material relatively impervious to a noble gas fluoride that will be used in a subsequent etching step. For example, base layer 202 may be of silicon dioxide ($SiO_2$). Base layer 202 may be deposited by plasma-enhanced chemical vapor deposition (PECVD) to a thickness of 7000 Angstroms. The thickness of base layer 202 and the manner by which it is formed may be varied to suit specific applications.

In a multi-level integrated circuit, base layer 202 may also be deposited on an upper level rather than on a first level above the substrate. For example, base layer 202 may be deposited overlying a metal level to form a floating metal structure that may be used as a second level interconnect line. It is to be noted that as used in the present disclosure, the terms "overlying" and "underlying" refer to the relative placement of two +layers that may or may not be directly in contact with each other; that is, the two layers may be separated by another layer.

As shown in FIG. 1A, a sacrificial layer 203 is deposited overlying substrate 201 and on top of base layer 202. Sacrificial layer 203 is used to define a subsequently formed floating metal structure, and is preferably of a material preferentially etched by a noble gas fluoride. For example, sacrificial layer 203 may be a polycrystalline silicon or amorphous silicon layer that will be subsequently etched by a noble gas fluoride such as xenon difluoride ($XeF_2$). Sacrificial layer 203 may be deposited by PECVD or physical vapor deposition (PVD) to a thickness of 5000 Angstroms, for example.

Figure 1B:
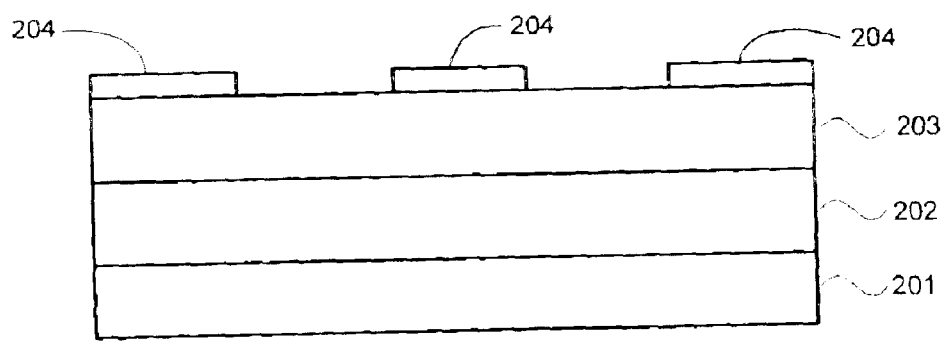
Figure 1C:
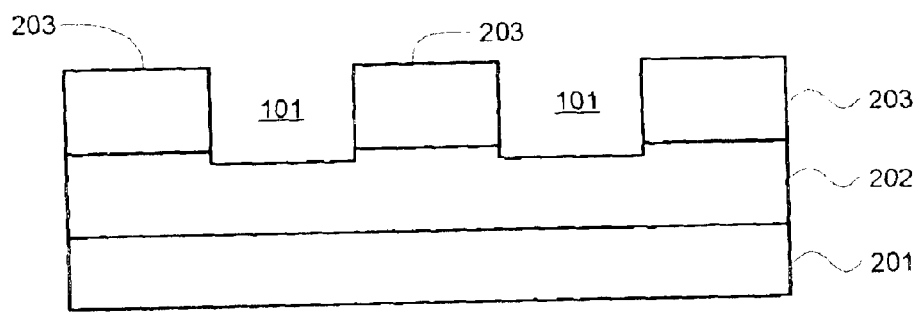

In FIG. 1B, masks 204 are formed on sacrificial layer 203 to define at least one opening in which a metal will be deposited. In FIG. 1C, openings 101 are formed by etching portions of sacrificial layer 203 not covered by masks 204. Openings 101 expose base layer 202. Openings 101 preferably extend into a portion of base layer 202 to strongly anchor a subsequently formed floating metal structure, and thereby prevent the floating metal structure from lifting off. For example, openings 101 may extend at least 500 Angstroms into base layer 202 to form a gouge in which a floating metal structure may be anchored.

Openings 101 may be formed using a two-step etch process. The first etching step involves the etching of sacrificial layer 203 using base layer 202 as an etch stop. A suitable etchant for etching a sacrificial layer 203 of polycrystalline silicon in the first etching step is a chemistry that includes HBr, $Cl_2$, and $O_2$. The second etching step involves etching into base layer 202. The second etching step may be a timed etch of a base layer 202 of silicon dioxide using a chemistry the includes $CF_4$, $CHF_3$, and argon. Masks 204 are removed after the formation of openings 101.

Figure 1D:
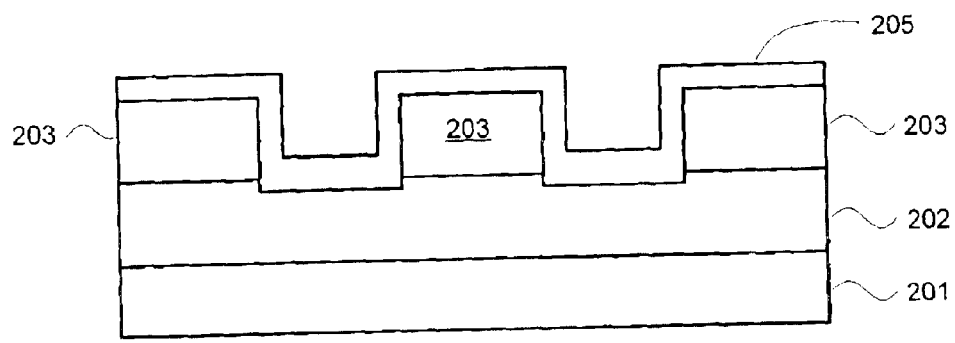

In FIG. 1D, a support material 205 may be deposited in openings 101 and on sacrificial layer 203. Support material 205 provides further support to a subsequently formed floating metal structure. However, support material 205 may not be required in some applications. In those applications, the floating metal structure is directly formed in openings 101. Support material 205 is preferably relatively impervious to a noble gas fluoride. For example, material 205 may be a 500 Angstrom silicon nitride ($Si_3N_4$) layer deposited by PECVD.

Figure 1E:
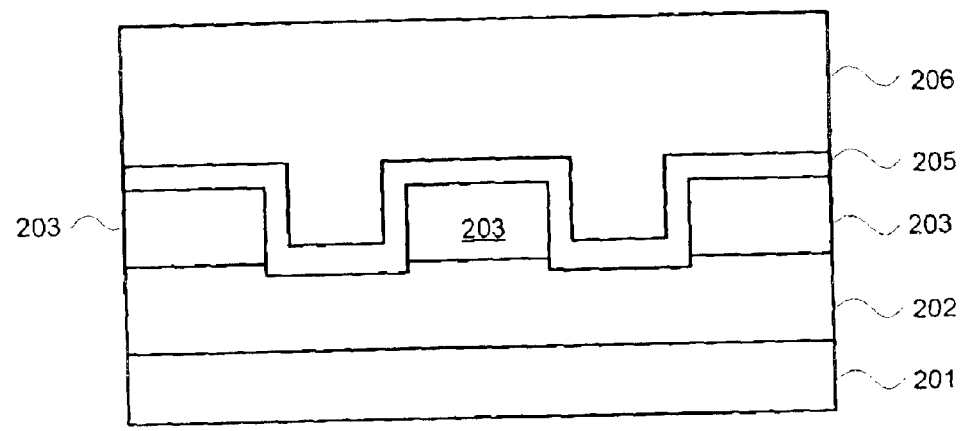
Figure 2:
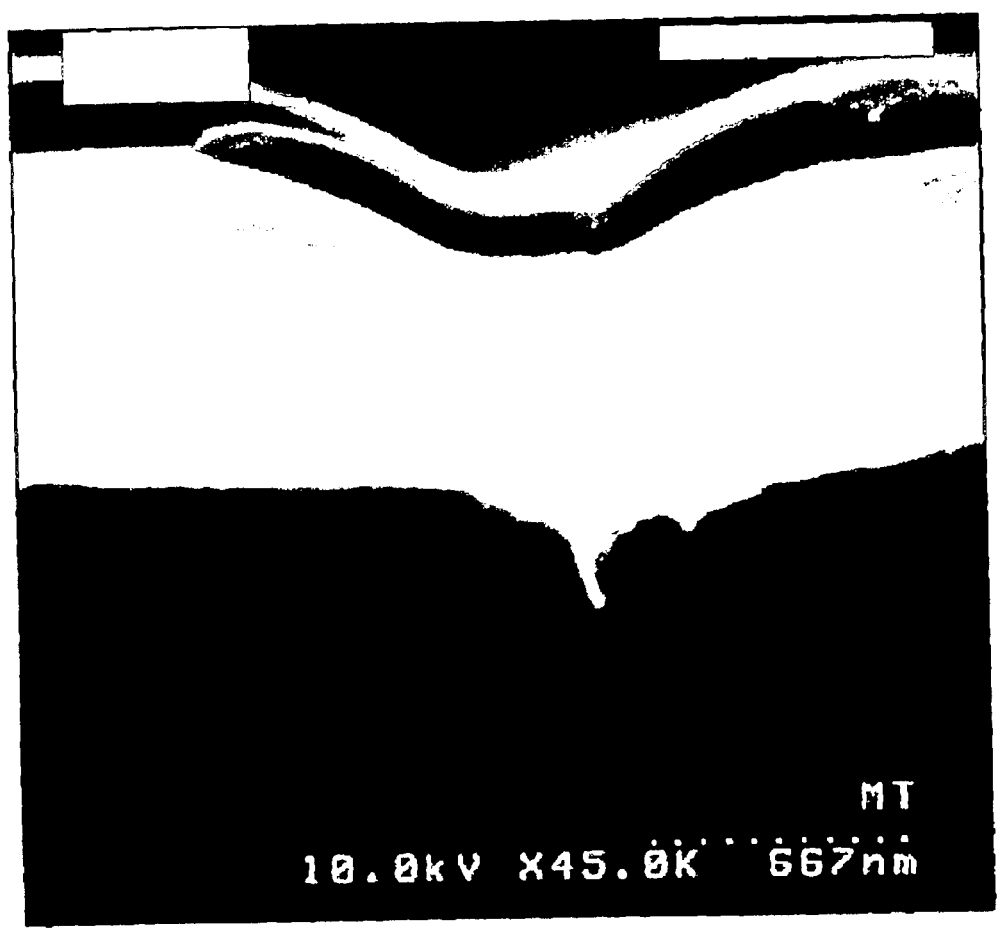
FIG. 2 shows a scanning electron micrograph of a cross-section of a sample similar to that shown in FIG. 1E.

In FIG. 1E, a metal 206 is deposited in openings 101 and on support material 205. Metal 206 fills the remaining space in openings 101. Metal 206 may be an interconnect material or a metal employed in the formation of on-chip inductors. For example, metal 206 may be a stack (not shown) that includes a 300 Angstrom thick titanium layer deposited on support material 205, an 8000 Angstrom thick aluminum layer deposited on the titanium layer, and a 300 Angstrom thick titanium-tungsten (or titanium-nitride) layer deposited on the aluminum layer. Metal 206 may also include copper. Other metals or stacks may also be used without detracting from the merits of the present invention. FIG. 2 shows a scanning electron micrograph (SEM) of a sample similar to that shown in FIG. 1E.

Figure 1F:
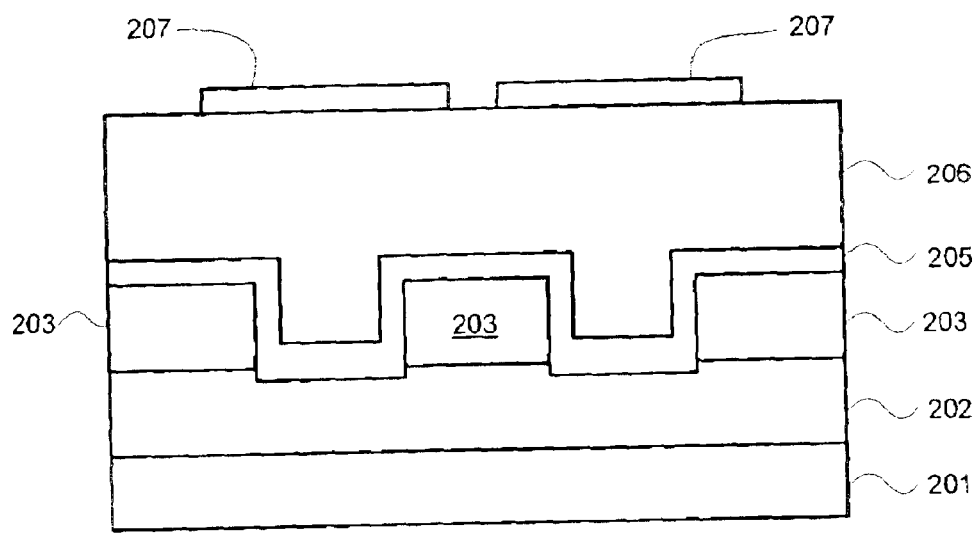
Figure 1G:
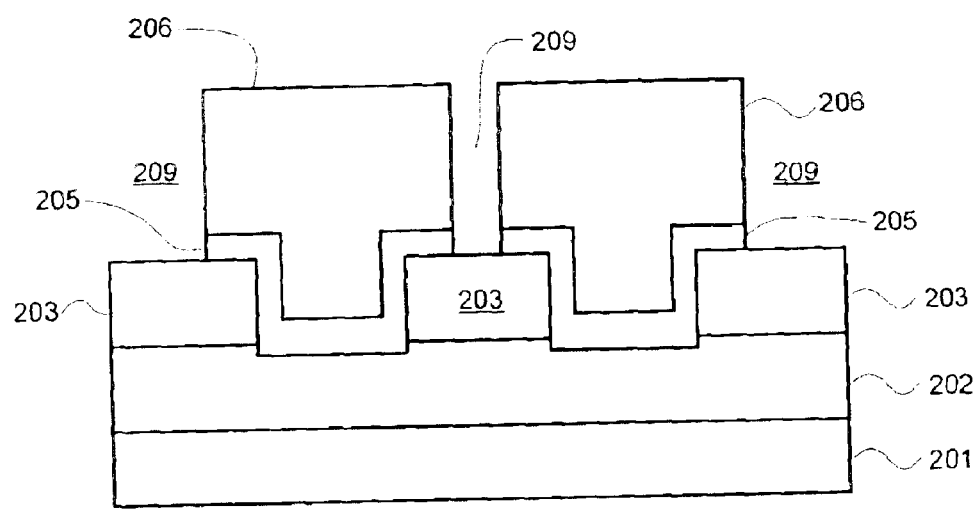

Referring to FIG. 1F, masks 207 are formed on metal 206 to define openings 209 (see FIG. 1G). In FIG. 1G, openings 209 are formed by etching through metal layer 206 and support material 205, thereby exposing sacrificial layer 203. A metal etch process using a chemistry that includes $SF_6$, $Cl_2$, $BCl_3$, and argon may be used to etch a metal 206 of aluminum and support material 205 of silicon nitride. Masks 207 are removed after the formation of openings 209.

Prior to a subsequent step of etching sacrificial layer 203, native oxide on the surface of sacrificial layer 203 may have to be removed. For example, a sacrificial layer 203 of polycrystalline silicon may have native oxide thereon. In that case, the sample is first dipped in a pre-etch solution of ethylene glycol and ammonium fluoride prior to etching sacrificial layer 203. A suitable commercially available pre-etch solution includes that of the type available from ACSI, Inc. of Milpitas, Calif. under the name NOE Etch I™ solution.

Figure 1H:
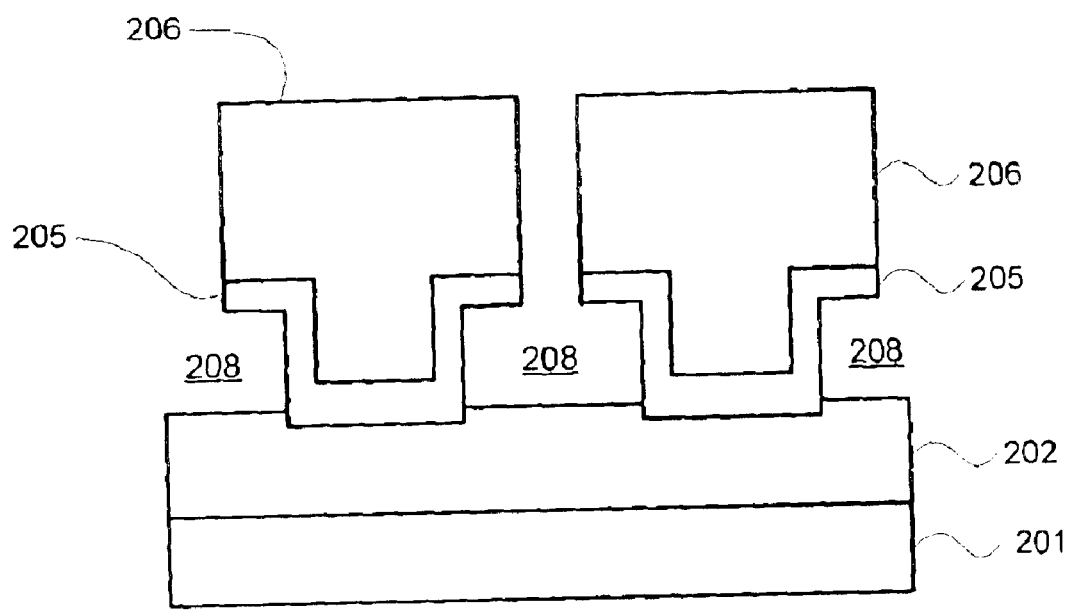

In FIG. 1H, the sample of FIG. 1G is placed in an environment including a noble gas fluoride to etch sacrificial layer 203 without substantially etching metal 206 and support material 205. Preferably, the noble gas fluoride includes xenon difluoride. Other noble gas fluorides that may be used include those of krypton and argon. Xenon difluoride has been used as an etchant in micro-electro-mechanical systems (MEMS) applications. For example, U.S. Pat. No. 5,726,480 issued to Pister discloses the use of xenon difluoride in the fabrication of MEMS structures. U.S. application Ser. No. 09/952,626, entitled "MICROELECTRONIC MECHANICAL SYSTEM AND METHODS", filed by Mike Bruner on Sep. 13, 2001, also discloses the use of xenon difluoride as an etchant. The aforementioned disclosures by Pister and Bruner are incorporated herein by reference in their entirety.

It is to be noted that unlike a MEMS structure which uses metals primarily for mechanical functions, an integrated circuit employs metals primarily to carry electrical signals. Reducing the capacitance on a metal line, while of minimal concern to the fabrication of MEMS structures, is important in integrated circuit applications.

Figure 3:
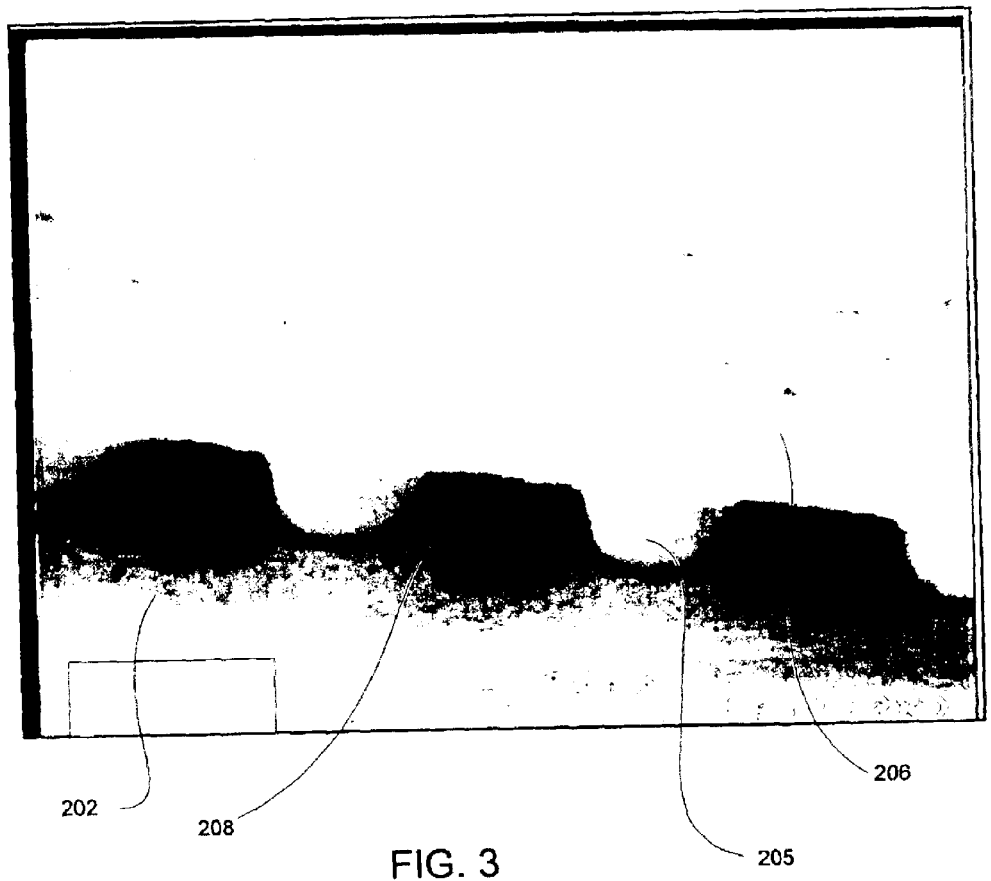
FIG. 3 shows a scanning electron micrograph of a floating metal structure formed in accordance with an embodiment of the present invention.

Still referring to FIG. 1H, the step of etching sacrificial layer 203 using a noble gas fluoride results in a floating metal structure defined by metal 206. The resulting floating metal structure has a pillar that includes portions of metal 206 surrounded by support material 205. The floating metal structure also includes an overhang that includes portions of metal 206 overlying air cores 208. An air core 208 is a unity-k dielectric in that it provides a dielectric region with a dielectric constant approaching 1. Thus, air cores 208 lower the capacitance on a metal 206 by providing a unity-k dielectric region between the metal 206 and substrate 201, and between metals 206. As can be appreciated, a method of forming a floating metal structure in accordance with an embodiment of the present invention allows for the creation of a unity-k dielectric region without having to employ complex structural systems. FIG. 3 shows an SEM of a floating metal structure formed in accordance with an embodiment of the present invention.

Figure 4:
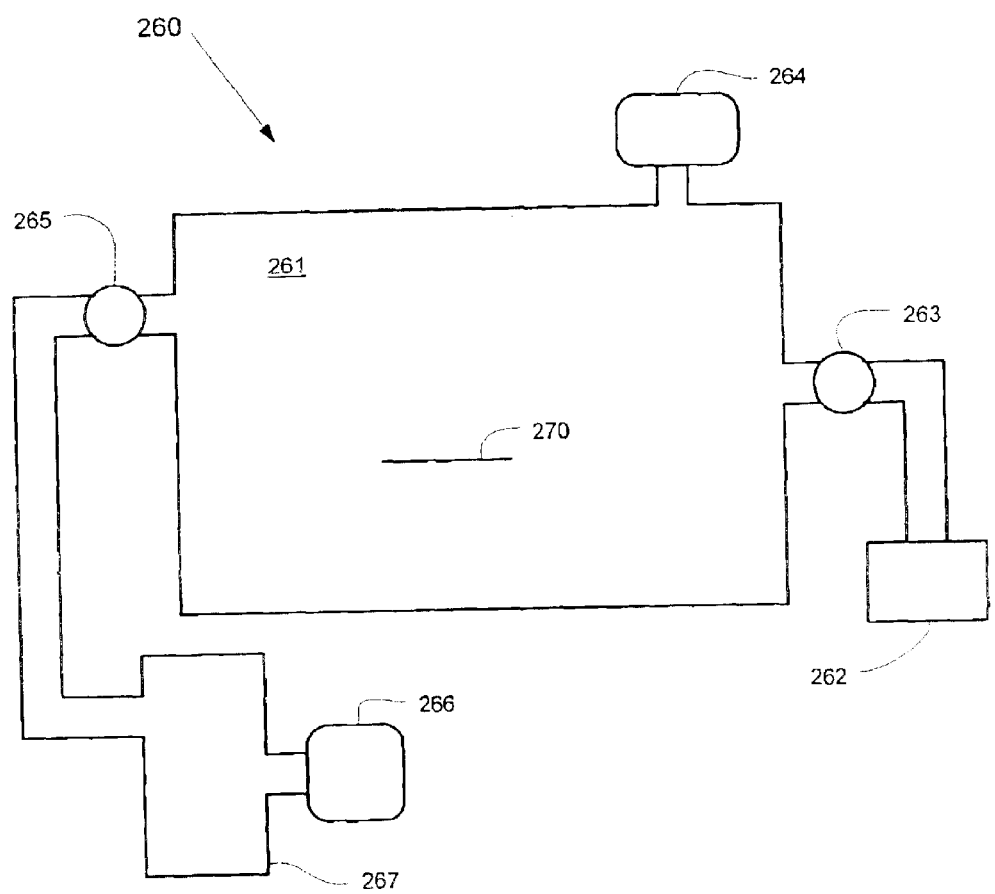
FIG. 4 shows a schematic diagram of a reactor for etching a sacrificial layer in accordance with an embodiment of the present invention.

Referring now to FIG. 4, there is shown a schematic diagram of a reactor 260 for etching a sacrificial layer in accordance with an embodiment of the present invention. Reactor 260 includes a chamber environment 261 in which a sample 270 is placed. Sample 270 includes an exposed sacrificial layer and may be the same sample as that shown in FIG. 1G. Reactor 260 includes a vacuum pump 262 for lowering the pressure within chamber environment 261. A control valve 263 allows chamber environment 261 to be isolated from pump 262 and allows for a controlled pump down. A pressure measuring device 264 allows for the monitoring of pressure within chamber environment 261.

A container 267 is coupled to chamber environment 261 through a controller 265, which may be a pressure or flow controller. A pressure monitoring device 266 may be coupled to container 267 to monitor the pressure therein. Container 267 may contain a noble gas fluoride source for etching a sacrificial layer. For example, container 267 may contain crystals of xenon difluoride that have been sublimed at a pressure in a range of 0.1 to 100 Torr, more preferably in a range of 0.5 to 20 Torr, and most preferably at approximately 4 Torr.

In operation, chamber environment 261 is pumped down to a pressure around $10^{-5}$ Torr. Under known conditions, xenon difluoride crystals at room temperature form a vapor pressure of approximately 4 Torr as determined by pressure measuring device 266. Controller 265 is adjusted to change the pressure of chamber environment 261 to approximately $50 \times 10^{-3}$ Torr. The resulting flow of xenon difluoride gas from container 267 into chamber environment 261 etches exposed sacrificial layers in sample 270. The process time for etching sacrificial layers depends on the reactor used, the pressure in chamber environment 261, and the physical details of sample 270. For example, sample 270 may be exposed in an environment of xenon difluoride gas for 2–5 minutes, and preferably for around 3 minutes and 30 seconds.

Figure 5:
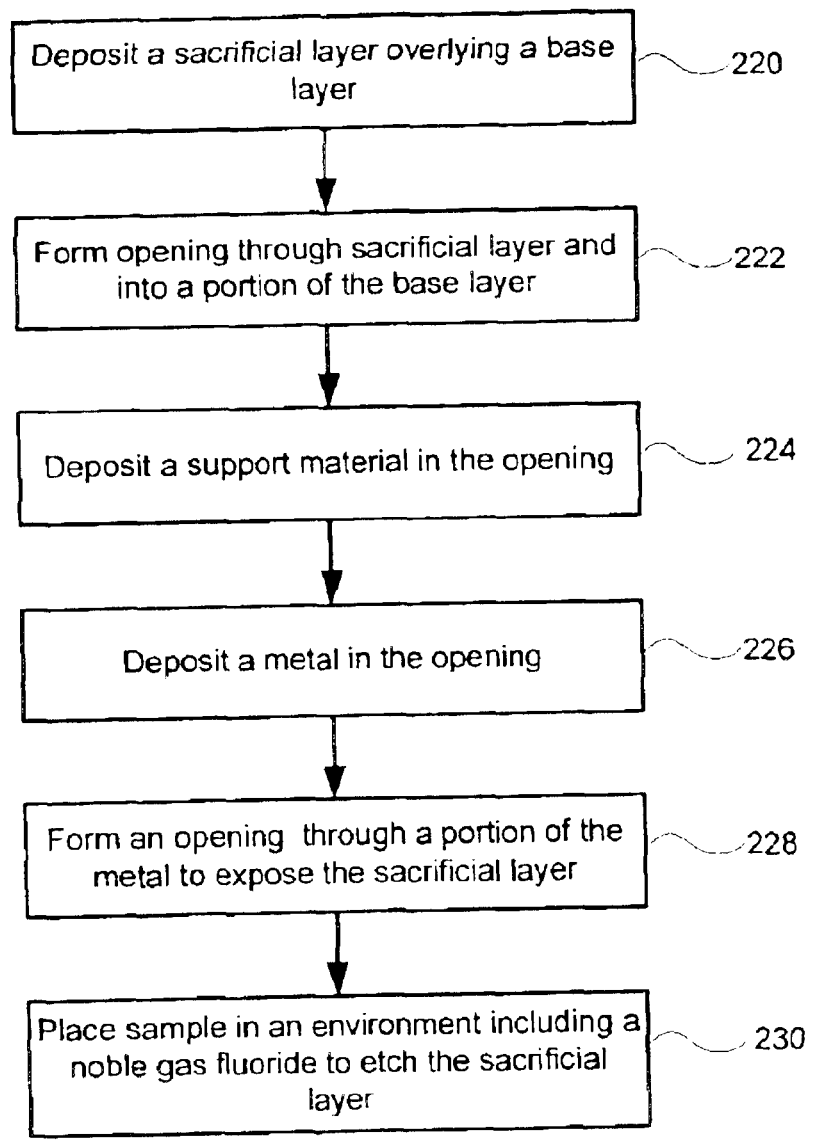
FIG. 5 shows a flow diagram of a method of forming a floating metal structure in accordance with an embodiment of the present invention.

FIG. 5 shows a flow diagram of a method of forming a floating metal structure in accordance with an embodiment of the present invention. In step 220, a sacrificial layer is deposited overlying a base layer. The sacrificial layer is preferably of a material that is preferentially etched by a noble gas fluoride. The sacrificial layer may be of polycrystalline silicon while the noble gas fluoride may be xenon difluoride. The base layer may be of an oxide such as silicon dioxide, for example.

In step 222, an opening is formed through the sacrificial layer. The opening preferably extends into the base layer to provide a gouge in the base layer where a floating metal structure may be anchored. In step 224, a support material such as silicon nitride is optionally deposited in the opening.

In step 226, a metal is deposited in the opening. The metal may be a single metal layer or a stack. For example, the metal may include an adhesion layer of titanium, an aluminum layer over the titanium, and an anti-reflective layer of titanium—tungsten over the aluminum. The metal may also include copper.

In step 228, an opening is formed through the metal and, if present, the support material to expose the sacrificial layer. In step 230, the sample is placed in an environment including a noble gas fluoride to etch the sacrificial layer, and thereby form a floating metal structure with a unity-k dielectric region.

Figure 6:
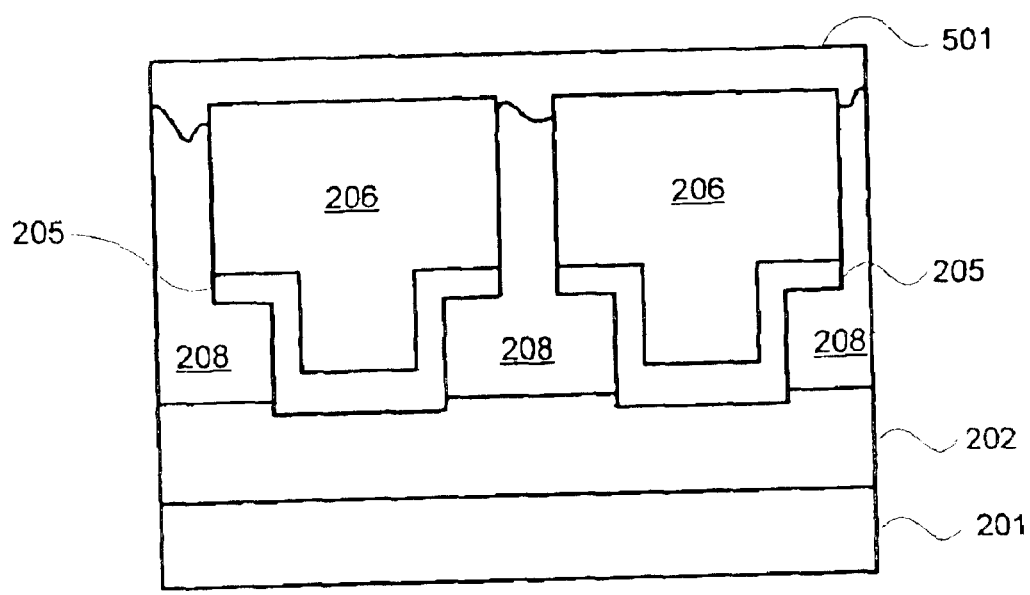
FIG. 6 shows a sectional view of a floating metal structure with an overlying layer in accordance with an embodiment of the present invention.

Additional layers may be deposited over a floating metal structure of the present invention in a number of ways. In FIG. 6, a non-metal layer 501 is deposited on a floating metal structure of a sample such as that shown in FIG. 1H. Non-metal layer 501 may be a silicon nitride layer deposited by PECVD, for example. Non-metal layer 501 is deposited such that it does not get into air cores 208. However, depending on deposition process parameters, non-metal layer 501 may or may not fill the space between side-by-side metals 20.

Figure 7A:
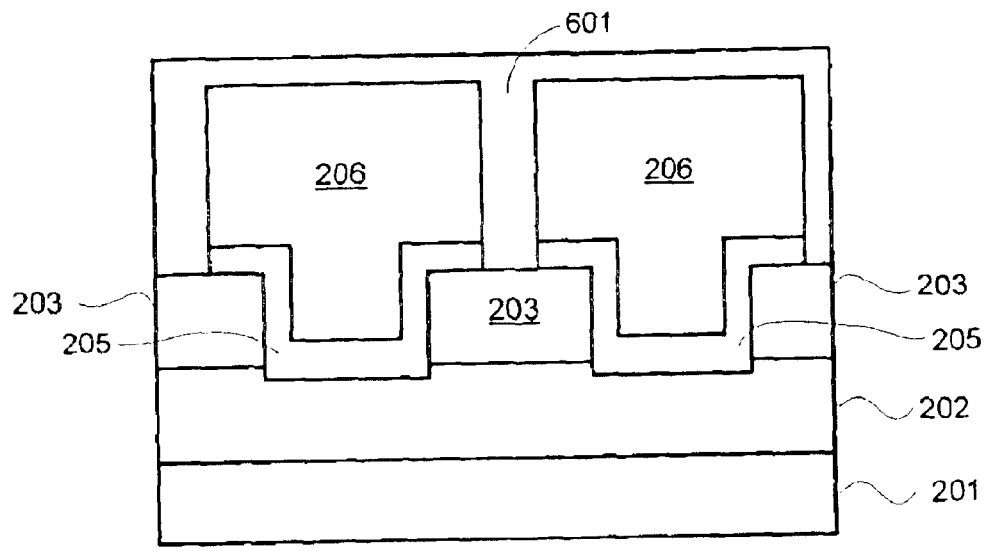
FIGS. 7A–7E show sectional views illustrating a way of depositing an overlying layer on a floating metal structure in accordance with an embodiment of the present invention.
Figure 7B:
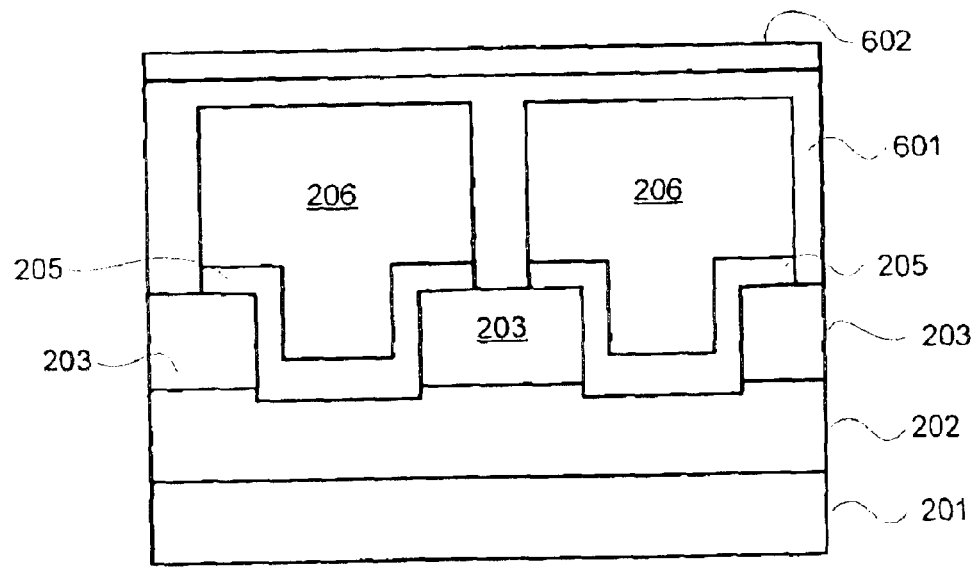

The sectional views of FIGS. 7A–7E illustrate another way of depositing additional layers over a floating metal structure of the present invention. In FIG. 7A, a silicon material 601 is deposited on a floating metal structure of a sample such as that shown in FIG. 1G. Silicon material 601 may be polycrystalline silicon deposited by PVD, for example. In FIG. 7B, a non-metal layer 602 is deposited on silicon material 601. For example, non-metal layer 602 may be of silicon dioxide.

Figure 7C:
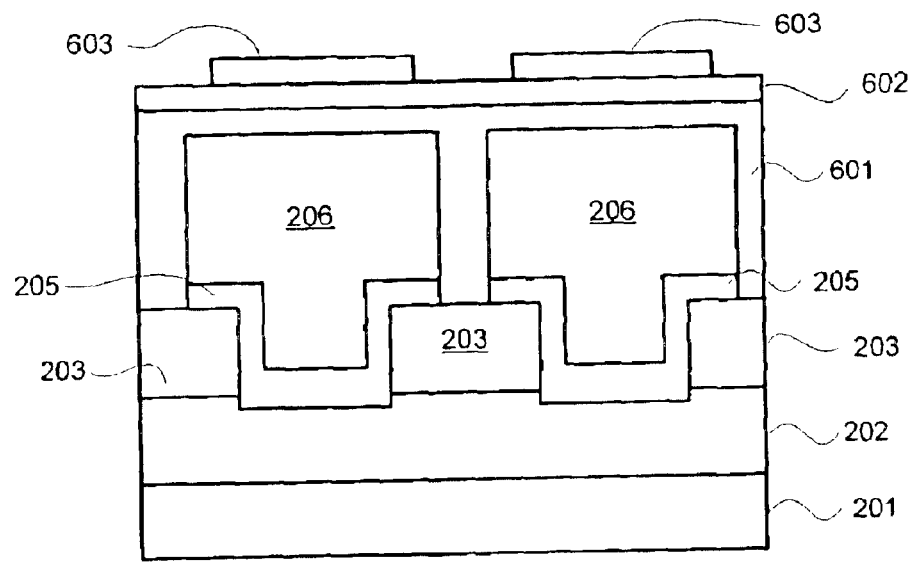
Figure 7D:
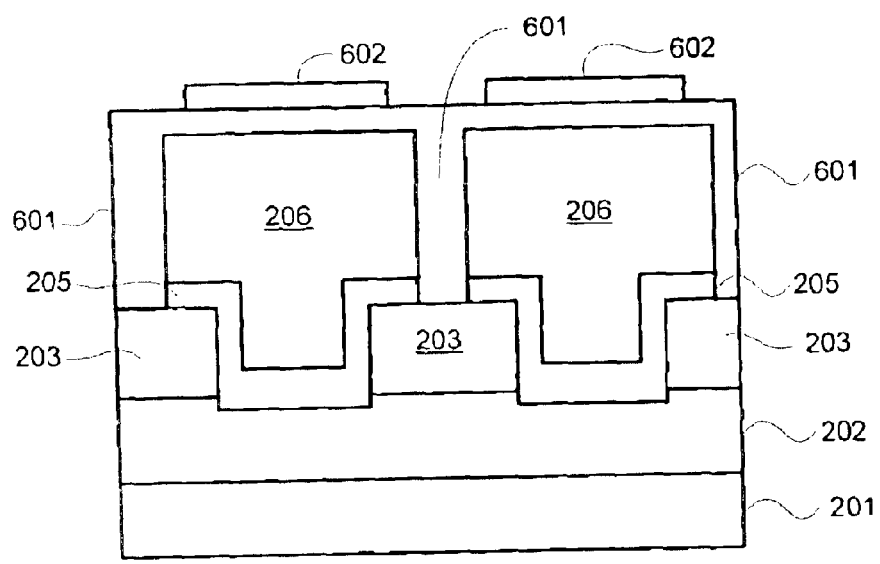

In FIG. 7C, masks 603 are formed on non-metal layer 602. Masks 603 define a window on non-metal layer 602 through which silicon material 601 will be exposed. In FIG. 7D, non-metal layer 602 is etched to form windows over silicon material 601. Thereafter, masks 603 are removed.

Figure 7E:
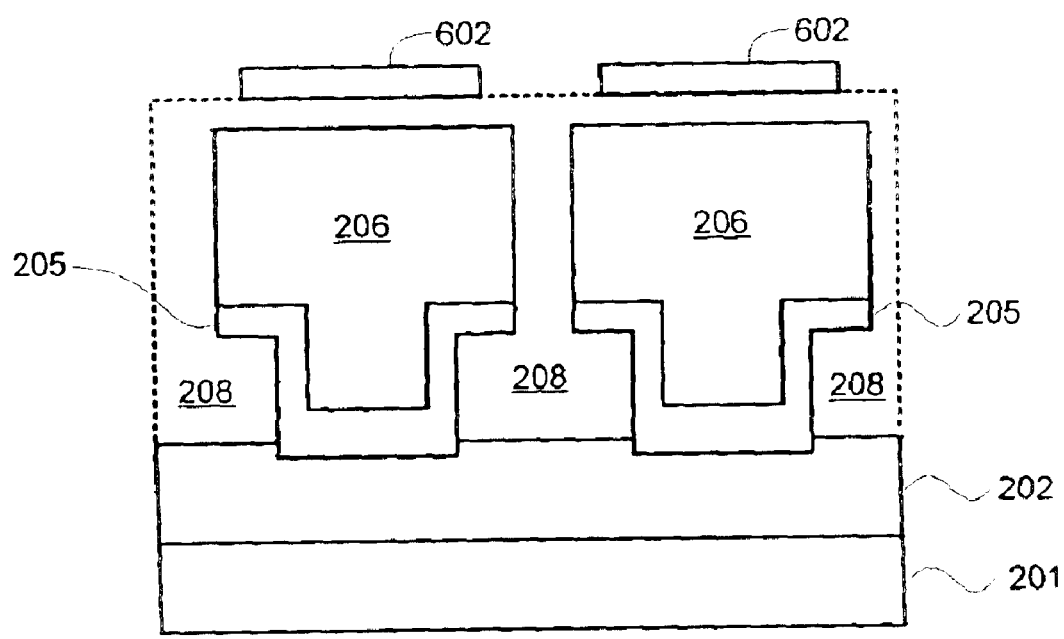

In FIG. 7E, the sample of FIG. 7D is placed in an environment including a noble gas fluoride to preferentially etch silicon material 601 and sacrificial layer 203, thereby forming air cores 208. For example, a silicon material 601 and sacrificial layer 203 of polycrystalline silicon may be etched using xenon difluoride. Note that the resulting floating metal structures defined by metals 206 are separated from substrate 201 and from each other by air cores 208. Also, non-metal layer 602 is separated from metal 206 by the air cores. Non-metal layer 602 is mechanically supported by other structures (not shown) in the integrated circuit.

The above description is provided to illustrate specific embodiments of the present invention and is not intended to be limiting. Numerous variations and modifications within the scope of the present invention are possible. For example, persons of ordinary skill in the art using the teachings of the present invention may transpose the order of the disclosed processing steps, interpose insignificant steps, or substitute materials equivalent to those disclosed herein. Thus, the present invention is limited only by the following claims.

What is claimed is:

1. A method of forming a metal structure in an integrated circuit, the method comprising:

depositing a metal in a first opening in a sacrificial layer and over the sacrificial layer, the sacrificial layer overlying a base layer;

exposing a portion of the sacrificial layer;

depositing a silicon material over the metal;

depositing a non-metal layer over the deposited silicon material;

forming a second opening in the non-metal layer to expose the deposited silicon material; and removing at least a portion of the deposited silicon material and the sacrificial layer between the metal and the base layer in an environment including a noble gas fluoride to form an air core between the metal and the base layer in the integrated circuit.

2. The method of claim 1 wherein the noble gas fluoride includes xenon difluoride.

3. The method of claim 1 wherein the sacrificial layer includes polycrystalline silicon.

4. The method of claim 1 wherein the first opening extends into a portion of the base layer.

5. The method claim 1 wherein the base layer includes an oxide layer.

6. The method of claim 1 further comprising:

prior to depositing the metal, depositing a support material in the first opening.

7. The method of claim 6 wherein the support material includes silicon nitride.

8. The method of claim 1 wherein the non-metal layer includes silicon nitride.

9. The method of claim 1 wherein the non-metal layer includes an oxide layer.

10. The method of claim 1 wherein the silicon material includes polycrystalline silicon.

* * * * *